United States Patent
Kwasnicki

(10) Patent No.: US 11,728,455 B2
(45) Date of Patent: Aug. 15, 2023

(54) METHOD OF MANUFACTURING μ-TANDEM PHOTOVOLTAIC CELLS AND μ-TANDEM PHOTOVOLTAIC CELL PRODUCED BY THIS METHOD

(71) Applicant: ML System Spolka Akcyjna, Zaczernie (PL)

(72) Inventor: Pawel Kwasnicki, Rzeszow (PL)

(73) Assignee: ML System Spolka Akcyjna, Zaczernie (PL)

( * ) Notice: Subject to any disclaimer, the term of this patent is extended or adjusted under 35 U.S.C. 154(b) by 32 days.

(21) Appl. No.: 17/510,511

(22) Filed: Oct. 26, 2021

(65) Prior Publication Data
US 2022/0140177 A1 May 5, 2022

(30) Foreign Application Priority Data
Oct. 29, 2020 (PL) .......................................... 435800

(51) Int. Cl.
| | |
|---|---|
| *H01L 31/18* | (2006.01) |
| *H01L 31/0216* | (2014.01) |
| *H01L 31/0236* | (2006.01) |
| *H01L 31/0352* | (2006.01) |
| *H01L 31/078* | (2012.01) |

(Continued)

(52) U.S. Cl.
CPC .... *H01L 31/1864* (2013.01); *H01L 31/02167* (2013.01); *H01L 31/02363* (2013.01); *H01L 31/035218* (2013.01); *H01L 31/078* (2013.01); *H01L 31/0384* (2013.01); *H01L 31/03685* (2013.01)

(58) Field of Classification Search
CPC ........... H01L 31/1864; H01L 31/02167; H01L 31/02363; H01L 31/035218; H01L 31/078; H01L 31/03685; H01L 31/0384
See application file for complete search history.

(56) References Cited

U.S. PATENT DOCUMENTS

| | | | | |
|---|---|---|---|---|
| 4,536,607 A | * | 8/1985 | Wiesmann | .......... H01L 31/0749 |
| | | | | 136/258 |
| 5,211,761 A | * | 5/1993 | Noguchi | ............... H01L 31/182 |
| | | | | 136/258 |

(Continued)

FOREIGN PATENT DOCUMENTS

| | | |
|---|---|---|
| CN | 210156403 | 3/2020 |
| KR | 20190129370 | 11/2019 |

(Continued)

*Primary Examiner* — Golam Mowla
(74) *Attorney, Agent, or Firm* — Defillo & Associates, Inc.; Evelyn A. Defillo

(57) ABSTRACT

A method of producing photovoltaic cells with the μ-tandem architecture based on crystalline silicon substrates and quantum dots, ensuring both effective and stable operation of the entire tandem system as well as high absorption in the spectral range from UV to MIR and operation in scattered and incident light conditions at different angles, acting as an anti-reflective layer. A further purpose of the invention is to develop a new structure of a μ-tandem photovoltaic cell based on microcrystalline silicon (Si) layers and a layer of nanometric semiconductor structures with a core-shell architecture such that the resulting structures work as a tandem cell with the characteristics of micro-cells, connected together in its lower part.

8 Claims, 1 Drawing Sheet

(51) Int. Cl.
*H01L 31/0368* (2006.01)
*H01L 31/0384* (2006.01)

(56) References Cited

U.S. PATENT DOCUMENTS

| | | | | |
|---|---|---|---|---|
| 5,344,498 | A | * | 9/1994 | Inoue .................... H01L 31/054 136/258 |
| 5,421,909 | A | * | 6/1995 | Ishikawa ........... H01L 31/02167 136/258 |
| 6,346,431 | B1 | | 2/2002 | Yoo et al. |
| 2003/0111106 | A1 | * | 6/2003 | Nagano ............... H01L 31/0543 257/E31.13 |
| 2005/0000564 | A1 | * | 1/2005 | Sato ........................ C23C 16/04 257/E31.13 |
| 2007/0151596 | A1 | * | 7/2007 | Nasuno ............. H01L 31/02363 136/256 |
| 2009/0142874 | A1 | * | 6/2009 | Arai .................... H01L 31/0236 438/57 |
| 2011/0162710 | A1 | * | 7/2011 | Watai ................ H01L 31/02363 257/E31.13 |
| 2013/0206219 | A1 | * | 8/2013 | Kurtin .................. H01L 31/048 136/255 |
| 2018/0374977 | A1 | | 12/2018 | Geerligs et al. |

FOREIGN PATENT DOCUMENTS

| | | |
|---|---|---|
| PL | 203033 | 8/2009 |
| PL | 231379 | 2/2019 |
| WO | WO2019200327 | 10/2019 |

\* cited by examiner

METHOD OF MANUFACTURING μ-TANDEM PHOTOVOLTAIC CELLS AND μ-TANDEM PHOTOVOLTAIC CELL PRODUCED BY THIS METHOD

FIELD OF THE INVENTION

The subject of the invention is a method of manufacturing of μ-tandem photovoltaic cells and a μ-tandem photovoltaic cell produced in this way on the basis of crystalline silicon substrates modified with semiconductor quantum dots.

BACKGROUND OF THE PRIOR ART

The well-known and widely used solar silicon cells are already close to the theoretical limit of their efficiency—the Shockley_Queisser limit of about 33% and they currently achieve efficiency of about 24%. One way to increase efficiency is to use tandem groups of PV cells in which at least two photosensitive PV cells or layers are placed one above the other. The different cells in this case are ideally different in terms of spectral sensitivity (for example, different cells have the corresponding maximum efficiency for different spectral ranges of sunlight). The result is that the tandem cell group as a whole offers much higher performance over a wider spectral range. Such a tandem group of cells may, for example, be a conventional silicon-based PV cell to which another perovskite-based PV cell is added. As a result, a perovskite-based photovoltaic cell has a higher absorption coefficient in the range of higher electromagnetic radiation (EM) energies and transmits light with lower energies—shorter electromagnetic waves, while a silicon-based photovoltaic cell absorbs more EM waves with lower energies, i.e. longer waves, so that the light transmitted through the cell or perovskite layer or at least part of it is absorbed by the silicon focus.

The information provided above shows that tandem cells are created after folding several layers that absorb light, and each of them effectively absorbs in other ranges of the light wavelength, thanks to which they are able to generate electricity much more efficiently than traditional photovoltaics, while still most of the modules are currently silicon versions.

Quantum dots are nano-dimensional zero-dimensional semiconductors in which the movement of electrons is limited in all three directions and the energy of the electron is quantized, with quantum dots being a special type of nanoparticles whose characteristics are closely related to their size. The smaller the diameter of the quantum dot is, the larger the band gap between the top of the valence band and the bottom of the conduction band. For example, the smaller the particle diameter is, the emission spectrum shifts towards shorter wavelengths, and this phenomenon has been called the Quantum Size Effect. Thus, nanoparticles are a class of materials whose properties are defined by the characteristics of particles having a size less than about 100 nm. Changing the shape and size of nanoparticles affects such properties as: emission wavelength, magnetic properties and charge transport in semiconductor systems. The key element is the use of nanoparticles in the design of materials whose properties can be controlled by the nanoparticle size scale, which can be used as components of devices and functional systems using new technologies, preferably also in solar cells, BIPV installations—in which quantum dots as sensitizers adsorbed are on the photoelectrode. The most frequently synthesized quantum dots are structures composed of: CdSe, CdTe and CdSe/CdS, and due to their small size from 1 to 100 nm, they have discrete energy levels similar to those found in atoms. Known are photovoltaic (solar) cells including a conductive glass plate and a counter electrode and a $TiO_2$ photoelectrode sensitized with quantum dots with an electrolyte placed between them. There is also a known method of obtaining thin homogeneous transparent layers with electronic conductivity, consisting in magnetron sputtering of doped tin oxide on the surface of the glass pane ($SnO_2$).

The patent specification WO2019200327A1 discloses a monolithic tandem photovoltaic cell, comprising a first electrode, a CIGS light absorption section on this electrode, an ITO (tin and indium oxide) interconnecting layer on the CIGS light absorption section and a perovskite light-absorbing section on this connecting layer having a polished surface on which a perovskite light-absorbing section is formed, said connecting layer providing an electrically conductive and optically transparent connection between said CIGS light-absorbing section and the perovskite light-absorbing section.

From the utility model patent description no. CN210156403U, a laminated solar cell is known, including a homogeneous crystalline silicon n-type solar cell based on a PERC structure (a back-contact passivated emitter cell) as a bottom cell and a perovskite solar cell with a transparent electrode as an upper cell. The structure of the laminated solar cell consists sequentially of a metal bottom electrode, a perforated bottom electrode passivation layer, a partial or fully doped n-type silicon layer, a strongly p-type emitter, an emitter passivation layer, a tunnelling layer, an electron transporting layer, and a perovskite absorption layer. This cell is based on the main homojunction crystalline PERC solar cell.

The tandem solar cell known from the US patent application US2018374977A1 consists of an upper and a lower solar cell. The upper solar cell and the lower solar cell have a front surface and a rear surface, respectively, and the respective front surfaces are adapted to face the radiation source in use. The upper solar cell is arranged with the rear surface above the front surface of the lower solar cell. The upper solar cell contains a photovoltaic absorber layer with a band gap greater than that of crystalline silicon. The lower solar cell contains a crystalline silicon substrate. Placed on at least a portion of the front surface of the lower solar cell is a passivating layer stack that includes a dielectric thin film and a secondary layer either of a selective carrier removal material or polysilicon. A thin dielectric film Known from the Korean patent application KR20190129370A tandem photovoltaic cell with increased efficiency due to increasing the current density of the upper photovoltaic cell and the lower photovoltaic cell. This tandem photovoltaic cell comprises: a first photovoltaic cell and a second photovoltaic cell with different strands, and an intermediate layer sandwiched between the two cells containing a $SiO_x$ and doped microcrystalline silicon substrate, electrically connecting the two photovoltaic cells in the substrate.

There is also known from U.S. Pat. No. 6,346,431 a quantum dot device operating in the near infrared range and a method for its production. This device is a diode and has a layered structure using quantum dots called GaAs/InAs self-growing dots. They are produced in such way that the first indium arsenide wetting layer is applied to the gallium arsenide substrate, and then the gallium arsenide layer heavily doped with indium $I_{nx}Ga_{(1-x)}As$, which, due to the network mismatch, spontaneously transforms into small nanometric grains called GaAs/InAs quantum dots. There-after, a buffer layer is applied to which a barrier layer of undoped aluminium gallium arsenide in the form of $Al_{(y)}Ga_{(1-y)}As$ is applied. On both sides of the layer structure, there are applied electrodes, each of which is made on a substrate of the doped contact layer, the electrodes being connected to a power source. The emission of infrared radiation (near infrared) occurs when the electrodes are connected to a power source (in a photoluminescent diode system) or irradiated with the gallium arsenide layer constituting the substrate. In order to produce coherent photons, excitons are used there, i.e. electron-hole pairs in self-growing quantum dots, which simultaneously bind both electrons and holes, and in the case of an exciton laser, light is created as a result of the recombination of the radiant electron-hole pair in the quantum dot. The energy of the photon is then in the order of the semiconductor band gap, which corresponds to the red or near infrared radiation for GaAs/InAs dots.

On the other hand, the Polish patent description no. PL203033 describes a quantum dot device for generating coherent far infrared radiation and a method of producing inversion of occupations in a matrix of quantum dots applied with an electric field in a narrow quantum well in a semiconductor heterostructure. The essence of the quantum dot device according to this invention is that the layered structure is embedded between metal electrodes, the bottom electrode of which is made of a continuous conductive layer, while the upper electrode is made of a perforated metal layer. The layer structure with electrodes is a capacitor in which a lower barrier and an upper barrier are applied between the metal electrodes on the substrate, and there is a quantum well between the barriers. The shape and size of the upper electrode holes determine the electron-binding potential in the small nanometre-sized regions of the quantum well that constitute quantum dots. Preferably, the substrate is made of $Al_{0.3}Ga_{0.7}As$ gallium arsenide doped with Cr chromium, the lower and upper barrier is made of an undoped layer of gallium aluminium arsenide in the form of $Al_{0.3}Ga_{0.7}As$, and the quantum well is made of a GaAs gallium arsenide layer. The device according to this invention uses completely different quantum dots, namely quantum dots produced by means of an electric field, i.e. by electrostatic focusing of electrons in a thin Ga(Al)As quantum well. The thickness of the well is on the order of 2 nm, which ensures a quasi-two-dimensional movement of electrons in the well. The multilayer structure of a quantum well is produced in a standard way, i.e. molecular beam epitaxy (MBI) methods overlay $Al_{0.3}Ga_{0.7}$ As barrier layers, between which a thin GaAs layer is located. As a result of the shifts of the band edges in both materials, the GaAs layer forms a quantum well into which electrons flow from the additional $Al_{0.3}Ga_{0.7}As$ layer doped with Cr chromium to the extent depending on the needs of electron density in the well. A thin continuous metal electrode is placed under the well structure, and a perforated electrode made by ion or electron lithography from a thin metal layer is placed above the well. These electrodes, when connected to an electric voltage, generate an appropriately modulated electric field distribution related to the perforation of the upper electrode, leading to a side binding potential for electrons in the quantum well, which is also a repulsive potential for holes. Contrary to self-growing dots, empty dots caused by an electric field bind only electrons, not excitons. In turn, the essence of the method of applying the inversion of occupations in the matrix of quantum dots applied with an electric field according to this invention consists in the fact that the voltage control signal supplied to the electrodes is cyclically switched on and off, between which a semiconductor heterostructure with a thin quantum well is placed, in which the spatially modulated field is electric, with a perforated electrode, binds electrons in small areas of quantum dots, as a result of which an inversion of the electron state occupations in these dots is obtained. Coherent far-infrared photons with a wavelength corresponding to the energy distance between states in quantum dots are then emitted, the voltage control signal being turned on quickly and nonadiabatically. The control signal, which turns the quantum dot matrix on and off cyclically, produces an increasing number of coherent photons of infrared radiation in the space between the mirrors of the optical resonator until the resonator of the coherent radiation of the desired power is obtained.

The Polish patent description No. PL 231379 discloses also a thin-film electromagnetic radiation converter based on a quantum dot quasizer-dimensional structure, having a layer structure equipped with a positive electrode and a negative electrode. This converter consists of two external glass plates with a thickness of g=0.5-4.0 mm, thermally hardened or chemically strengthened by the ion method in a brine bath, the internal surfaces of which are inseparably connected with transparent conductive layers of metal oxides, preferably TCO with a thickness of 400-600 nm, equipped at their opposite ends with a positive electrode and a negative electrode, where the conductive layer and its positive electrode of the first glass plate are inseparably connected with a nanoparticle—semiconducting layer of titanium dioxide $TiO_2$ with a thickness of 500-2000 nm, and with it a layer of zero-dimensional quantum dot structures with a thickness of 50-600 nm and a diameter of 2-12 nm of QDs type is permanently connected by spraying, on which a high-efficiency transport coating of the HTL type with a thickness of 200-5000 nm made of durable electrically conductive polymer is also deposited using the spray method, preferably of the "PEDOT" type on which there is placed a negative electrode with a conductive layer, which are connected to a second glass plate, the side walls of which are laminated by means of a laminating foil, preferably of the "EVA" type, with the side walls of both conductive layers, the HTL transport layer of the QDs quantum dot layer and the $TiO_2$ semiconductive layer, and with the side walls of the first glass plate to form a monolithic thin film converter of electromagnetic radiation.

SUMMARY OF THE INVENTION

The purpose of the invention is to develop a new method of producing photovoltaic cells with the μ-tandem architecture based on crystalline silicon substrates and quantum dots, ensuring both effective and stable operation of the entire tandem system as well as high absorption in the spectral range from UV to MIR and operation in scattered and incident light conditions at different angles, acting as an anti-reflective layer. A further purpose of the invention is to develop a new structure of a μ-tandem photovoltaic cell based on microcrystalline silicon (Si) layers and a layer of nanometric semiconductor structures with a core-shell architecture such that the resulting structures work as a tandem cell with the characteristics of micro-cells, connected together in its lower part.

The method of manufacturing μ-tandem photovoltaic cells based on silicon substrates according to the invention is characterized by the fact that it is carried out in four successive steps, consisting in that:

in the first step, on the upper surface of the silicon lamellar substrate with its corrugated texture, made of Si microcrystals of silicon with the grain size of mulliticrystalline silicon <1 μm with its lower surface metallized—the electrode, colloidal material with a thickness of 6 nm-80 nm in the form of dispersed quantum dots with a concentration of 5 mg/ml-50 mg/ml, with a spheroidal architecture and their diameter below 45 nm or with a rhodoid architecture and their diameter below 120 nm is placed with spray or rollblade method, built on the basis of elements from the group II-VI, in the vicinity of an electric field "E" with an intensity of 0.5 V/m-4.5 V/m perpendicularly situated on its lines to the surface of this silicon substrate and with an absorption range ranging from 320 nm-1800 nm, while the method spray coating is realized by means of spray nozzles that dispense colloidal material using an ultrasonic process to break up the particles of this material at a frequency of 1800 MHz-2000 MHz so that the generated jet has a substantially conical shape with an opening angle of 115°-120°, and the spraying capacity of these nozzles is from 250 ml/day-800 ml/day, while the rollblade method is carried out using a blade made of a dielectric material, which is wetted along its entire length with a colloid with quantum dots, and the speed of movement of this blade on the surface of the silicon substrate is from 30 cm/min-100 cm/min, and its height above the surface of the substrate does not exceed 1.5 mm, and the deposition process is carried out under atmospheric pressure in an atmosphere of inert gas with a purity of 99.9%, and then in the second step, the lamellar silicon substrate with a layer of colloidal material on it is placed in a thermal chamber and subjected to a heat treatment process for 5 minutes-25 minutes at a temperature of 70° C.-90° C. with a temperature profile of 10° C./min and in an atmosphere of inert gas and the quantum dots dispersing material contained in the colloidal material is evaporated, then the obtained intermediate is removed from this chamber and allowed to cool to room temperature (21° C.), and then in the third step, the cooled semi-finished product of this photovoltaic cell is rinsed with flowing inert gas at a pressure of 0.6 bar-1 bar with a purity of 99.99%, obtaining a passivation layer with a thickness of 5 nm-8 nm, and then in the fourth step, the semi-finished product of this cell is subjected to the process of coating with a protective layer with aluminium oxide ($Al_2O_3$), magnetron method at room temperature, so that the deposited material is supplied in the form of a source $Al_2O_3$ target with a purity of 99.8%, a melting point of 2072° C. and at an evaporation pressure of $10^{-4}$ Torr, the melting point value is 1550° C. and the density of the source material is 3.97 g/cc±10%, while the process of magnetron deposition of the protective layer consists in applying on this modified surface of the substrate material composed of atomized in a magnetic field ions coming from the surface of the source target, using in this process the interaction of charged particles with the magnetic field, and the ion flux is generated by bombarding the surface of this target with particles of ionized gas—argon, resulting from the application of electric voltage between the surfaces of the carrier and sources, obtaining a protective layer constituting the upper shell of this cell with a thickness of 100 nm-380 nm and an absorption coefficient in the VIS range of less than 5%.

It is preferred that the quantum dot dispersing material contained in the colloidal material is toluene.

It is preferred that the quantum dot dispersing material contained in the colloidal material is water.

It is also preferred that the quantum dot dispersing material contained in the colloidal material is oleic acid.

It is also preferred if argon or nitrogen is used as the internal gas.

The spray nozzles are preferably spaced apart from each other over a width of 13 cm-15 cm and a height of 4 cm-5 cm above the silicon substrate.

It is also preferred if the blade used in the rollblade method is made of a dielectric material such as glass or ceramics.

BRIEF DESCRIPTION OF THE DRAWINGS

The subject of the invention is explained in more detail in the exemplary descriptions of the method of producing a μ-tandem photovoltaic cell and in the drawing, in which.

DETAILED DESCRIPTION OF THE INVENTION

Figure 1:
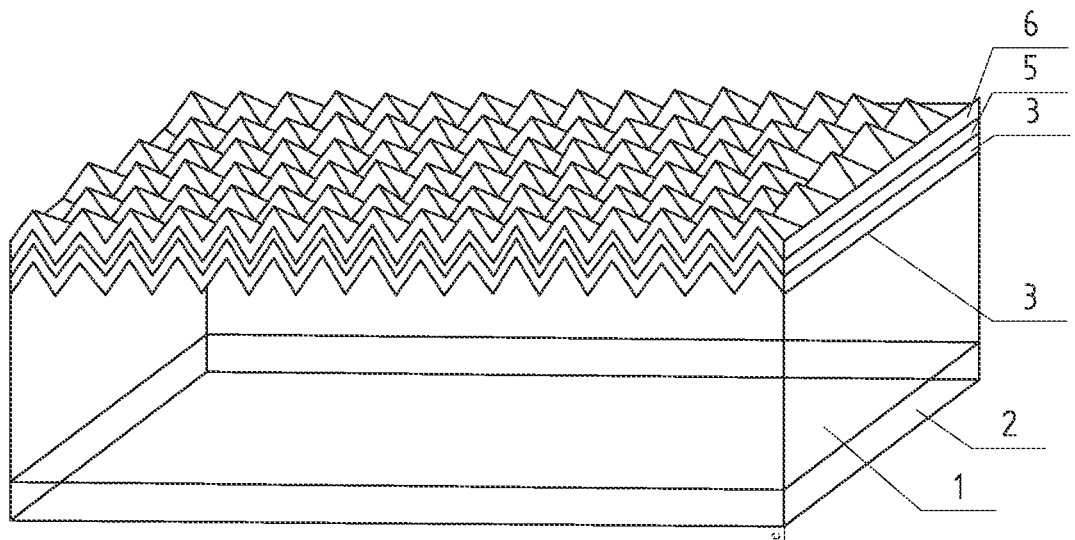
FIG. 1 shows a perspective view of the μ-tandem photovoltaic cell according to the present invention.
Figure 2:
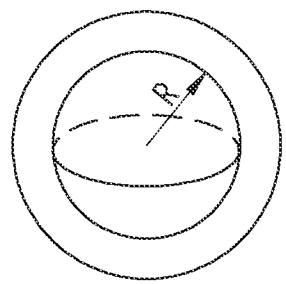
FIG. 2 shows a top view of a quantum dot with a core-shell 'spheroidal architecture.
Figure 3:
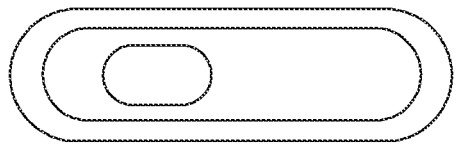
FIG. 3 shows a top view a quantum dot with core-shell rhodopid architecture.
Figure 4:
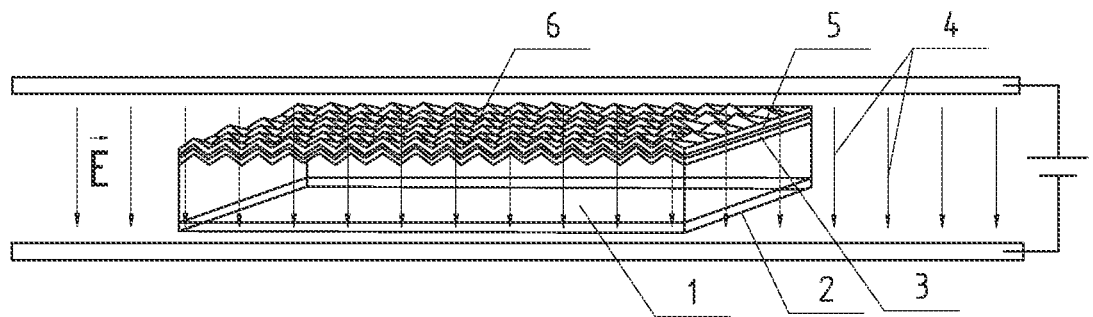
FIG. 4 shows a diagram of an electric field line orientation during the process of depositing the dispersed colloidal material on the lamellar surface of the micro silicon substrate.

The μ-tandem photovoltaic cell with a silicon substrate according to the invention is characterized by the fact that it is made of silicon (Si) microcrystals with a grain size of less than 1 μm, a silicon lamellar substrate, the lower flat surface of which has a metallized layer—the electrode, and the upper surface with a corrugated texture it is inseparably connected with a layer of dispersed colloidal material in the form of semiconductor quantum dots with spheroidal or rhodoid architecture, with a thickness of 6 nm-80 nm, which is inseparably connected with a passivation layer with a thickness of 5 nm-8 nm, which is shielded and connected to it is inseparably made of a 100 nm-380 nm protective layer made of aluminium oxide ($Al_2O_3$) with a purity of 99.8%, a melting point of 2072° C. for an evaporation pressure of $10^{-4}$ Torr, a melting point of 1550° C. and a density of the source material of 3.97 g/cc±10%, and having an absorption ratio VIS below 5%.

The μ-tandem photovoltaic cells produced by the method according to the invention, based on crystalline silicon substrates and quantum dots, ensure both effective and stable operation of the entire tandem system, as well as high absorption in the spectral range from UV to MIR, as well as operation in conditions of scattered and incident light at different angles. the function of the anti-reflective layer.

Example 1

As shown in FIGS. 1-4, the method of manufacturing a μ-tandem photovoltaic cell was carried out in four successive steps, including:

in the first step, on the upper surface of the lamellar silicon substrate 1 with its corrugated texture, made of Si microcrystals of silicon with a multicrystalline silicon grain size of 0.99 μm with its lower surface 2 metallized—negative electrode, dispersed colloidal material 3 was evenly applied by spray coating based on toluene in the form of dispersed quantum dots with a concentration of 5 mg/ml, with a spheroidal architecture and a diameter below 45 nm, built on the basis of elements from groups II-IV, surrounded by an electric field "E" of 0.5 V/m perpendicularly located on its lines 4 to the surface of the silicon substrate 1 and with an absorption range ranging from 320 nm-450 nm, the deposition process of these colloidal quantum dots was carried out using the spray method with spray nozzles spaced apart at a width of 13 cm and a height above this silicon substrate 1 of 5 cm. These nozzles metered the colloidal material 3 in the form of microdots using the ultrasonic process of breaking the particles of this colloid with a frequency of 1800 MHz, so that the produced stream had the shape of a cone with an opening angle of 115°, and the layer thickness of this dispersed colloidal material 3 was 6 nm, while the capacity of this spray was 250 ml/day, then in the second step, the lamellar silicon substrate 1 with a layer of colloidal material 3 deposited on it was placed in a thermal chamber and subjected to a heat treatment process for 5 minutes, at a temperature of up to 70° C. with a temperature profile of 10° C./min and in an inert gas atmosphere—argon, during which toluene contained in the colloidal material 3 was evaporated, as a result of which only semiconductor nanocrystals remained on the surface of the silicon lamellar substrate 1 on the silicon lamellar substrate 1, then the obtained semi-product was removed from this chamber and allowed to cool it to room temperature (21° C.) then in the third step, the obtained and cooled semi-finished product of this photovoltaic cell was flushed with inert gas—nitrogen with a purity of 99.99% under a pressure of 0.8 bar, obtaining a passivation layer 5 with a thickness of 5 nm protecting the micro-dimensional structures and allowing the deposition of this protective layer which was built of the same quantum dots to which the $H_2$ atoms were attached, ensuring chemical stability, and then in the fourth step, the semi-finished product of this photovoltaic cell with the structure of permanently connected quantum dots with silicon Si microcrystallites with a passivation layer 5 was subjected to the process of covering it with an upper protective layer 6 with aluminium oxide ($Al_2O_3$) by the magnetron method at room temperature, consisting in the deposited material was supplied as a source target $Al_2O_3$ with a purity of 99.8% and a melting point of 2072° C., for an evaporation pressure of $10^{-4}$ Torr, a melting point of 1550° C. and a source material density of 3.97 g/cc±10%, with the process of magnetron deposition of the protective layer 6 consisted in applying to this modified surface of the substrate a material composed of ions sprayed in the magnetic field from the surface of the source target, using in this process the interaction of charged particles with the magnetic field, and the ion flux was generated as a result of bombardment of the surface of this charge with particles of ionized gas—argon, formed as a result of applying an electric voltage between the surfaces of the carrier and the source, obtaining a protective layer 6 constituting the upper shell of this cell, 100 nm thick and an absorption coefficient in the VIS range of 4.5%.

Example 2

As shown in FIGS. 1-4, the method of manufacturing a μ-tandem photovoltaic cell was also carried out in four successive steps, consisting in the following:

in the first step, on the upper surface of the silicon lamellar substrate 1 with its corrugated texture, made of Si microcrystals of silicon with the grain size of mulliticrystalline silicon equal to 0.5 μm with its lower surface metallized 2—with the negative electrode, dispersed colloidal material 3 was evenly applied by spray coating on based on water in the form of dispersed quantum dots with a concentration of 50 mg/ml, with a spheroidal architecture and a diameter of less than 45 nm, built on the basis of elements from groups II-IV, surrounded by an electric field "E" with an intensity of 4.5 V/m perpendicularly situated its lines 4 to the surface of the silicon substrate 1 and with an absorption range ranging from 450 nm-850 nm, while the deposition process of these colloidal quantum dots was carried out using the spray coating method using spray nozzles spaced opposite each other at a width of 15 cm and a height above this silicon substrate 1 of 4 cm. These nozzles metered the colloidal material in the form of microdots using the ultrasonic process of breaking the particles of this colloid with a frequency of 2000 MHz, so that the produced stream had the shape of a cone with an opening angle of 120°, and the layer thickness of this dispersed colloidal material 3 was 80 nm, and the yield was this spray was 800 ml/day then in the second step, the lamellar silicon substrate 1 with a layer of colloidal material 3 deposited on it was placed in a thermal chamber and subjected to a heat treatment process at a temperature of 90° C. with a temperature profile of 10° C./min, and in an atmosphere of inert gas—nitrogen, and annealed over time 25 minutes, during which the water contained in the colloidal material 3 was evaporated, as a result of which only semiconductor nanocrystals remained on the surface of the silicon lamellar substrate 1 on the silicon lamellar substrate 1, then the obtained semi-product was removed from this chamber and allowed to cool to room temperature (21° C.) then in the third step, the thus obtained and cooled semi-finished product of this photovoltaic cell was subjected to a flushing process with inert gas—99.99% purity argon at a pressure of 1 bar, obtaining a passivation layer 5 with a thickness of 6 nm, protecting the micro-dimensional structures and allowing the deposition of this protective layer, which was built of the same quantum dots to which the $H_2$ atoms were attached, ensuring chemical stability, and then in the fourth step, the semi-finished product of this photovoltaic cell with the structure of permanently connected quantum dots with silicon Si microcrystallites with a passivation layer 5 was subjected to the process of covering it with an upper protective layer 6 with aluminium oxide (Al2O3) by the magnetron method at room temperature, consisting in the deposited material was provided as a source target of Al2O3 with a purity of 99.8%, a melting point of 2072° C., for an evaporation pressure of $10^{-4}$ Torr, a melting point of 1550° C. and a source material density of 3.97 g/cc±10%, with the process of magnetron deposition of the protective layer 6 consisted in applying to this modified substrate surface a material composed of ions sprayed in the magnetic field from the surface of the source target, using in this process the interaction of charged particles with the magnetic field, and the ion flux was generated as a result of the boom barding the surface of this target with particles of ionized gas—argon, resulting from the application of electric voltage between the surfaces of the carrier and the source, obtaining a protective layer constituting the upper shell of this cell, 380 nm thick and an absorption coefficient in the VIS range of 4.99%.

Example 3

As shown in FIG. 1-4, the method of manufacturing a μ-tandem photovoltaic cell was also carried out in four successive steps, including:

in the first step, on the upper surface of the silicon lamellar substrate 1 with its folded structure made of Si microcrystals of silicon with the grain size of mulliticrystalline silicon equal to 0.7 μm with its lower surface metallized 2—negative electrode, dispersed colloidal material 3 prepared on the basis of oleic acid, with a concentration of 25 mg/ml quantum dots with a rhodoid (rod) architecture with a diameter below 120 nm, built on the basis of elements from groups IV-VI and with an absorption range from 850 nm to 1800 nm, in the vicinity of an electric field with an intensity "E" of 2.5 V/m perpendicularly located its lines 4 to the surface of this silicon substrate, the deposition process of these rhodoid quantum dots was carried out using the rollblade method, using a blade made of a glass-type dielectric material, which was wetted along its entire length colloid with quantum dots, and the speed The blade travel time on the surface of silicon substrate 1 was 30 cm/min, and its height above the surface of this substrate did not exceed 1.5 mm, and the deposition process was carried out under atmospheric pressure in an atmosphere of argon as an inert gas with a purity of 99.9%, obtaining a layer thickness the dispersed colloidal material 3 of 25 nm, then in the second step, the lamellar silicon substrate 1 with a layer of colloidal material 3 deposited on it was placed in a thermal chamber and subjected to a heat treatment process for 15 minutes and at a temperature of 75° C. with a temperature profile of 10° C./min and in an atmosphere of argon gas, during which the oleic acid contained in the colloidal material 3 was evaporated, as a result of which only semiconductor nanocrystals remained on the surface of the layer of colloidal material 3 applied to the silicon lamellar substrate 1, then the obtained semi-product was removed from this chamber and allowed to cool to room temperature (21° C.) and then in the third step, the obtained and cooled semi-finished product of this photovoltaic cell was flushed with inert gas—argon with a purity of 99.99% under a pressure of 0.6 bar, obtaining a passivation layer with a thickness of 8 nm securing the microdimensional structures and allowing the deposition of this protective layer, which was built of the same quantum dots to which the $H_2$ atoms were attached, ensuring chemical stability, and then in the fourth step, the semi-finished product of this photovoltaic cell with a structure of permanently connected quantum dots with silicon Si microcrystallites with a passivation layer 5 was subjected to the process of covering it with an upper protective layer 6 with aluminium oxide $(Al_2O_3)$—the magnetron method at room temperature consisting in the material was supplied as a source $Al_2O_3$ target with a purity of 99.8%, a melting point of 2072° C., with an evaporation pressure of $10^{-4}$ Torr, a melting point of 1550° C. and a source material density of 3.97 g/cc±10%, the process of magnetron deposition of the layer consisted in applying on this modified surface of the substrate a material composed of ions sprayed in the magnetic field from the surface of the source target, using in this process the interaction of charged particles with the magnetic field, and the ion flux was generated as a result of the bombardment of the surfaces He dissects the target with particles of ionized argon gas formed by the application of electric voltage between the surfaces of the carrier and the source, obtaining the protective layer 6 constituting the upper shell of this cell with a thickness of 150 nm and an absorption coefficient in the VIS range at the level of 4.8%.

In a variant of the embodiment of the photovoltaic cell described in example 3, in its second step, the speed of the blade sliding on the surface of the silicon substrate 1 was 100 cm/min, while a ceramic blade was used for the rollblade process, and in the fourth step, the passivation layer 5 was covered with a protective layer 6 with aluminium oxide $(Al_2O_3)$ constituting the upper shell of this cell, 380 nm thick.

Example 4

The μ-tandem photovoltaic cell manufactured by the method described in the first example, as shown in FIG. 1, consists of a lamellar silicon substrate 1 made of Si microcrystals with a mulliticrystalline silicon grain size of 0.9 μm, the lower flat surface of which had a metallized layer 2 meeting function of the negative electrode, and its upper surface with corrugated texture was combined with the spray coating method with a layer of dispersed colloidal material 3 in the form of semiconductor quantum dots with a spheroidal architecture and a thickness of 6 nm, which was combined with the method of flushing with nitrogen with a purity of 99.99% as an inert gas with a passivation layer 5 with a thickness of 5 nm made of the same quantum dots, which in turn was covered by a magnetron protection layer 6 connected to it with a thickness of 100 nm made of aluminium oxide (Al2O3) with a purity of 99.8%, melting point of 2072° C. at evaporation pressure $10^{-4}$ Torr, a melting point of 1550° C. and a source material density of 3.97 g/cc±10%, and a VIS absorption coefficient of 4.5%.

Example 5

The μ-tandem photovoltaic cell manufactured by the method described in the third example as shown in FIG. 1 consisted of a lamellar silicon substrate 1 made of Si microcrystals with a mulliticrystalline silicon grain size of 0.7 μm, the lower flat surface of which had a metallized layer 2 meeting function of the negative electrode, and its upper surface with corrugated texture was combined with the spray rollblade method with a layer of dispersed colloidal material 3 in the form of semiconductor quantum dots with rhodoid architecture and 80 nm thickness, which was combined with the argon flushing method with 99.99% purity as an inert gas with a passivation layer 5 with a thickness of 8 nm made of the same quantum dots, which in turn was covered by a magnetron protective layer 6 connected to it with a thickness of 380 nm made of aluminium oxide (Al2O3) with a purity of 99.8%, melting point of 2072° C. at evaporation pressure $10^{-4}$ Torr has a melting point of 1550° C. and a source material density of 3.97 g/cc±10%, and a VIS absorption coefficient of 4.99%.

The invention claimed is:

1. The method of manufacturing tandem photovoltaic cells with a silicon lamellar substrate and having a layer in the form of quantum dots, the method comprising the successive steps of:

in a first step, an upper surface of the silicon lamellar substrate (1) with a folded texture, made of silicon microcrystals (Si) with a grain size of mulliticrystalline silicon <1 μm with a—lower surface metallized (2)—an electrode, that is evenly applied by spray coating or by a rollblade method, a colloidal material (3) with a thickness of 6 nm-80 nm in the form of dispersed quantum dots with a concentration of 5 mg/ml-50 mg/ml, with a spheroidal architecture and—a diameter below 45 nm or with a rhodoid architecture and their diameter less than 120 nm, built on the basis of elements from groups II-VI, in the vicinity of an electric field "E" of intensity 0.5 V/m-4.5 V/m perpendicularly situated its lines (4) to the upper surface of the silicon lamellar substrate (1) and with an absorption range ranging from 320 nm-1800 nm, while the spray coating method is carried out by means of spray nozzles that dispense the colloidal material (3) with the use of the traditional process of breaking the particles of this material at a frequency of 1800 MHz-2000 MHz, so that the stream produced has essentially the shape of a cone with an opening angle ranging from 115°-120°, and the spraying capacity of these nozzles is from 250 ml/day-800 ml/24 hours, while the rollblade method is carried out using a blade made of dielectric material, which is wetted along its entire length with a colloid with the quantum dots, and the speed of the blade's movement on the upper surface of the silicon lamellar substrate (1) ranges from 30 cm/min-100 cm/min, and its height above the upper surface of the substrate does not exceed 1.5 mm, and the deposition process is carried out under atmospheric pressure in an atmosphere of inert gas with a purity of 99.9%, and then in a second step, the silicon lamellar substrate (1) with a layer of the colloidal material (3) on it is placed in a thermal chamber and subjected to a heat treatment process for 5 minutes-25 minutes at a temperature of 70° C.-90° C. with a profile temperature of 10° C./min and in an atmosphere of intertidal gas and the material dispersing the quantum dots contained in the colloidal material (3) is evaporated, then the obtained intermediate is removed from this chamber and allowed to cool down to room temperature (21° C.), and then in a third step, the cooled semi-finished product of the prepared structure containing silicon lamellar substrate and the layer of the colloidal material is rinsed with flowing inert gas at a pressure of 0.6 bar-1 bar with a purity of 99.99%, obtaining a passivation layer (5) with a thickness of 5 nm-8 nm, and then in a fourth step, a semi-finished product of the prepared structure containing silicon lamellar substrate and the layer of the colloidal material is subjected to the process of covering with a protective layer (6) with aluminium oxide ($Al_2O_3$), magnetron method at room temperature, so that the deposited material is supplied in the form of a source $Al_2O_3$ target with a purity of 99.8%, a melting point of 2072° C. and at an evaporation pressure of 10−4 Torr, the melting point value is 1550° C. and the density of the source material is 3.97 g/cc±10%, while the process of magnetron deposition of the protective layer (6) consists in applying the modified surface of the substrate to the material composed of ions sprayed in the magnetic field from the surface of the source target, using in this process the interaction of charged particles with the magnetic field, and the ion flux is generated by bombarding the surface of this target with particles of ionized gas—argon, resulting from the application of electric voltage between the surfaces of the carrier and sources, obtaining a protective layer constituting the upper shell of this cell with a thickness of 100 nm-380 nm and an absorption coefficient in the VIS range of less than 5%.

2. The method according to claim 1, wherein a material in which the quantum dots are dispersed is toluene.

3. The method according to claim 1, wherein a material in which the quantum dots are dispersed is water.

4. The method according to claim 1, wherein a material in which the quantum dots are dispersed is oleic acid.

5. The method according to claim 1, wherein argon is used as the inert gas.

6. The method according to claim 1, wherein nitrogen is used as the inert gas.

7. The method according to claim 1, wherein the spray nozzles are spaced apart from each other over a width of 13 cm-15 cm and a height of 4 cm-5 cm above the silicon lamellar substrate (1).

8. The method according to claim 1, wherein the blade used in the rollblade method is made of a dielectric material such as glass or ceramics.

\* \* \* \* \*